(12) United States Patent
Kouma et al.

(10) Patent No.: US 9,601,680 B2
(45) Date of Patent: Mar. 21, 2017

(54) THERMOELECTRIC CONVERSION ELEMENT AND METHOD FOR MANUFACTURING SAME

(71) Applicant: FUJITSU LIMITED, Kawasaki-shi, Kanagawa (JP)

(72) Inventors: Norinao Kouma, Atsugi (JP); Osamu Tsuboi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/251,834

(22) Filed: Apr. 14, 2014

(65) Prior Publication Data

US 2014/0318588 A1    Oct. 30, 2014

Related U.S. Application Data

(63) Continuation of application No. PCT/JP2012/069755, filed on Aug. 2, 2012.

(30) Foreign Application Priority Data

Nov. 8, 2011    (JP) ................................ 2011-244856

(51) Int. Cl.
  *H01L 35/00*    (2006.01)
  *H01L 35/34*    (2006.01)
  (Continued)

(52) U.S. Cl.
  CPC .............. *H01L 35/32* (2013.01); *H01L 35/34* (2013.01)

(58) Field of Classification Search
  CPC ......... H01L 35/02; H01L 35/04; H01L 35/12; H01L 35/14; H01L 35/16; H01L 35/18;
  (Continued)

(56) References Cited

U.S. PATENT DOCUMENTS 5,817,188 A * 10/1998 Yahatz ................... H01L 35/10
                                                       136/201
5,969,238 A * 10/1999 Fischer .......................... 73/105
(Continued)

FOREIGN PATENT DOCUMENTS

JP        06-338636      12/1994
JP        10-4217         1/1998
(Continued)

OTHER PUBLICATIONS

Notification of Transmittal of Translation of the International Preliminary Report on Patentability (Form PCT/IB/338, Form PCT/IB/373 & Form PCT/ISA/237), PCT/JP2012/069755, 13 pages, dated May 22, 2014.

(Continued)

*Primary Examiner* — Eli Mekhlin
(74) *Attorney, Agent, or Firm* — Fujitsu Patent Center

(57) ABSTRACT

The present invention relates to a thermoelectric conversion element and a method for manufacturing the same and relates to suppression of breakage and deterioration of the thermoelectric conversion element due to partial pressurization from the vertical direction. This thermoelectric conversion element has: at least one n-type semiconductor body; at least one p-type semiconductor body; a first connecting electrode; a first out-put electrode for n-side output; and a second output electrode for p-side output, wherein areas of respective joint sections of the n-type semiconductor body with the first connecting electrode, the first output electrode, and the second output electrode and of the p-type semiconductor body with the first connecting electrode, the first output electrode, and the second output electrode are greater than respective cross-sectional areas in other positions, in an axial direction, of the n-type semiconductor body and the p-type semiconductor body.

7 Claims, 13 Drawing Sheets

(51) Int. Cl.
*H01L 37/00* (2006.01)
*H01L 35/32* (2006.01)

(58) Field of Classification Search
CPC ....... H01L 35/20; H01L 35/22; H01L 35/225;
H01L 35/24; H01L 35/26; H01L 35/32
See application file for complete search history.

(56) References Cited

U.S. PATENT DOCUMENTS

| | | |
|---|---|---|
| 2006/0118158 A1* | 6/2006 | Zhang et al. ................. 136/205 |
| 2006/0118160 A1* | 6/2006 | Funahashi et al. ........ 136/236.1 |
| 2009/0007952 A1* | 1/2009 | Kondoh et al. ............... 136/203 |
| 2013/0008479 A1* | 1/2013 | Chen ............................ 136/205 |

FOREIGN PATENT DOCUMENTS

| | | |
|---|---|---|
| JP | 11-274592 | 10/1999 |
| JP | 2004-241404 | 8/2004 |
| JP | 2006-294935 | 10/2006 |
| JP | 2006294935 A * | 10/2006 |
| WO | 2006/043514 A1 | 4/2006 |
| WO | 2010/120298 A1 | 10/2010 |
| WO | 2011019078 | 2/2011 |

OTHER PUBLICATIONS

International Search Report issued for corresponding International Patent Application No. PCT/JP2012/069755, mailed Nov. 6, 2012.
JPOA—Notification of Reason for Rejection issued for corresponding Japanese Patent Application No. 2013-542885 dispatched on Jul. 7, 2015 with partial English translation.

* cited by examiner

RELATED ART

THERMOELECTRIC CONVERSION ELEMENT AND METHOD FOR MANUFACTURING SAME

CROSS-REFERENCE TO RELATED APPLICATIONS

This application is a continuation of International Application No. PCT/JP2012/069755, filed on Aug. 2, 2012, now pending, herein incorporated by reference. Further, this application is based upon and claims the benefit of priority from the prior Japanese Patent Application No. 2011-244856, filed on Nov. 8, 2011 entire contents of which are incorporated herein by reference.

FIELD

The present invention relates to a thermoelectric conversion element and a method for manufacturing the same and relates to, for example, suppression of breakage and deterioration of a thermoelectric conversion element having a high aspect ratio and a micro structure.

BACKGROUND

In recent years, according to the rapid development of the MEMS technology, an interest on a micro thermoelectric conversion element is increasing. A normal thermoelectric conversion element, that is, the micro thermoelectric conversion element is manufactured through processes such as cutting. This is because a thermoelectric material is generally fragile and has low strength, and machining in a submillimeter order or less is therefore significantly difficult. When the machining is used, manufacturing of a curved surface and an uneven shape is difficult.

The micro thermoelectric conversion element is expected to be applied to a portable micro energy source, a local cooling device, a sensor, or the like. In particular, it is expected that the micro thermoelectric element is incorporated in a composite device for a sensor network and used as a maintenance-free power supply that uses waste heat and body temperature.

In the micro thermoelectric conversion element, since heat resistance of the element is significantly small, it is difficult to apply a large temperature difference to the thermoelectric conversion element. Therefore, it is desirable that an inter-electrode distance, that is, the thickness of the thermoelectric material can be easily adjusted as appropriate.

It is relatively easy to reduce the inter-electrode distance of the thermoelectric conversion element, that is, reduce the thickness of the thermoelectric material. However, it is considerably difficult to increase the inter-electrode distance, that is, increase the thickness of the thermoelectric material. In order to manufacture such a micro thermoelectric conversion element having a long inter-electrode distance, that is, a high aspect ratio, it is proposed to perform fine patterning of the thermoelectric material using a semiconductor process and a MEMS technique.

FIG. 12A to FIG. 12D are explanatory diagrams of a manufacturing process for the conventional micro thermoelectric conversion element. First, as illustrated in FIG. 12A, columnar holes 42 formed by fine patterns having a high aspect ratio are formed on a silicon substrate 41 by the MEMS technique to manufacture a silicon mold.

Subsequently, as illustrated in FIG. 12B, slurry including piezoelectric ceramics powder and a binder is applied to the silicon mold and a coating film 43 is formed by filling the columnar holes 42 with the slurry.

Subsequently, as illustrated in FIG. 12C, after the coating film 43 is dried, the binder is removed. Subsequently, after a sample, from which the binder is removed, is wrapped with ceramics powder for protection (not illustrated in the figure), the sample is pressurized and baked at a sintering temperature of the piezoelectric ceramics to form piezoelectric ceramics 44.

Subsequently, as illustrated in FIG. 12D, after the ceramics powder for protection is removed, the silicon mold is etched and removed and the piezoelectric ceramics 44 is extracted. Consequently, a basic configuration of the micro thermoelectric conversion element is completed.

Here, silicon that has a high melting point (1414° C.) and high hardness (Knoop hardness: 8.3 GPa) and for which fine and high-aspect patterning can be performed according to the development of the MEMS technology is used as the mold. Consequently, it is possible to form a particularly fine structural body compared with the machining.

Patent Literature 1: Japanese Patent Application Laid-Open No. H11-274592.

SUMMARY

However, when the method explained above is used, since the silicon has high thermal conductivity and a loss of heat energy is large, a process for removing the silicon mold is indispensable. Therefore, there is a problem in that the manufacturing process is complicated.

Further, since a thermoelectric structural body is exposed when the silicon mold is removed, there is a concern about breakage and deterioration of a device due to a physical stress and a chemical change in a mounting process for mounting a micro thermoelectric element on a composite device and during use of the device.

From an aspect disclosed herein, there is provided a thermoelectric conversion element having: at least one n-type semiconductor material structural body; at least one p-type semiconductor material structural body; a first connecting electrode connected in series to one end of the n-type semiconductor material structural body and one end of the p-type semiconductor material structural body; a first output electrode for an n-side output connected to an output side end portion of the n-type semiconductor material structural body; and a second output electrode for a p-side output connected to an output side end portion of the p-type semiconductor material structural body. Areas of respective joint sections of the n-type semiconductor material structural body and the p-type semiconductor material structural body with the first connecting electrode, the first output electrode and the second output electrode are greater than respective cross-sectional areas in other positions, in an axial direction, of the n-type semiconductor material structural body and the p-type semiconductor material structural body.

From another aspect disclosed herein, there is provided a method for manufacturing a thermoelectric conversion element, having: exposing a photosensitive glass substrate to form exposed sections arranged in a matrix shape; providing a mask having opening sections greater in diameter than the exposed sections on the photosensitive glass substrate to perform etching, and forming through-holes each having large-diameter sections in upper and lower end portions thereof; filling half of the through-holes with n-type semiconductor material particles using an aerosol deposition method to form an n-type semiconductor material structural body; filling remaining half of the through-holes with p-type semiconductor material particles using the aerosol deposition method to form a p-type semiconductor material structural body; connecting, using a first connecting electrode, a large-diameter section of one end portion of the n-type semiconductor material structural body and a large-diameter section of one end portion of the p-type semiconductor material structural body adjacent to each other; and connecting, using a second connecting electrode, a large-diameter section of the other end portion of another p-type semiconductor material structural body adjacent to a large-diameter section of the other end portion of the n-type semiconductor material structural body.

With the thermoelectric conversion element and the method for manufacturing the thermoelectric conversion element disclosed herein, it is possible to suppress breakage and deterioration of the thermoelectric conversion element due to partial pressurization from the up-down direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
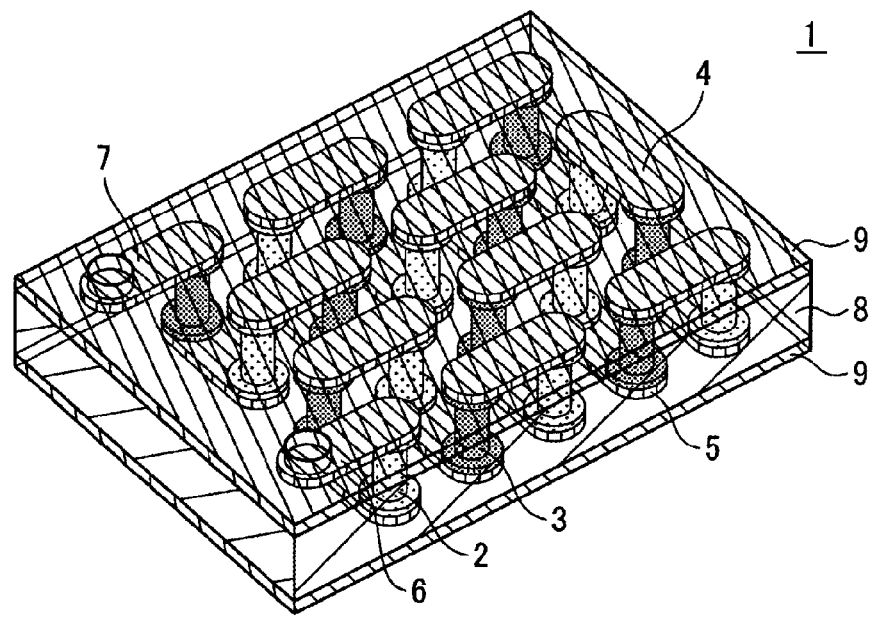
FIG. 1A and FIG. 1B are conceptual configuration diagrams of a thermoelectric conversion element in an embodiment of the present invention.
Figure 1B:
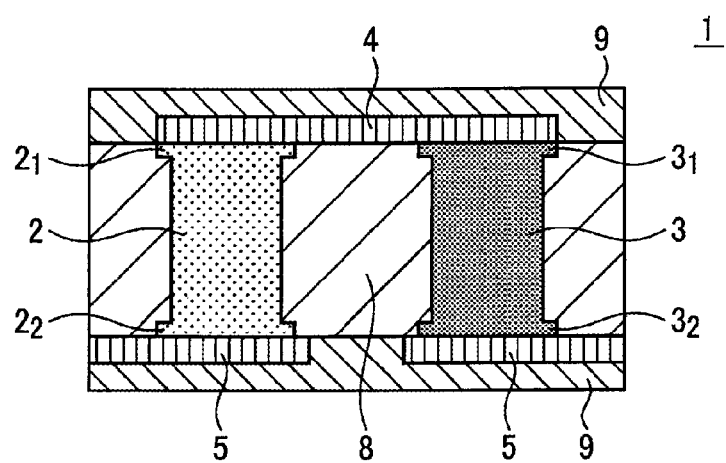

A thermoelectric conversion element in an embodiment of the present invention is explained with reference to FIG. 1A to FIG. 2C. FIG. 1A is a conceptual perspective view of the thermoelectric conversion element in the embodiment of the present invention. FIG. 1B is a conceptual main part sectional view of the embodiment of the present invention. As illustrated in FIG. 1A and FIG. 1B, in a thermoelectric conversion element 1, one end of a columnar n-type semiconductor material structural body 2 and one end of a columnar p-type semiconductor material structural body 3 are connected in series by a first connecting electrode 4 and the other end of the n-type semiconductor material structural body 2 and the other end of the p-type semiconductor material structural body 3 are connected in series by a second connecting electrode 5.

A first output electrode 6 is connected to an end portion on an output side of the n-type semiconductor material structural body 2 and a second output electrode 7 is connected to an end portion on an output side of the p-type semiconductor material structural body 3. A protecting section 8 is provided between the n-type semiconductor material structural body 2 and the p-type semiconductor material structural body 3 adjacent to each other. Protection films 9 are provided on the upper surface and the lower surface.

The n-type semiconductor material structural body 2 and the p-type semiconductor material structural body 3 are a high aspect ratio structural body consisting of a thermoelectric material. A shortest diameter on a horizontal cross section is 5 µm to 500 µm, for example, 50 µm, height is 50 µm to 500 µm, for example, 300 µm, and an aspect ratio is 1 to 40. Joint surfaces of upper end portions and lower end portions of the n-type semiconductor material structural body 2 and the p-type semiconductor material structural body 3 with respective electrodes are formed as large-diameter sections $2_1$, $2_2$, $3_1$, and $3_2$, which are anchors, and are greater in diameter by 1 µm to 20 µm, for example, 5 µm than the shortest diameter on the horizontal cross section.

Examples of an n-type semiconductor material include $Bi_2Te_3$, which can be formed as a film by the aerosol deposition method, $Na_xCoO$, and AZO obtained by doping Al in ZnO, which are oxide thermoelectric materials. Examples of a p-type semiconductor material include $Bi_{0.3}Sb_{1.7}Te_3$, and $Ca_3Co_4O_9$ which is an oxide material. Among these materials, $Bi_2Te_3$ and $Bi_{0.3}Sb_{1.7}Te_3$ are suitable in terms of handling easiness and element performance.

When the respective semiconductor material structural bodies are formed by the aerosol deposition method, fine holes (nano-voids) are formed on the inside of the semiconductor material structural bodies. That is, the semiconductor material structural bodies each include: a plurality of thermoelectric conversion material particles; amorphous portions or fine crystal portions which fill at least a part of spaces among the plurality of thermoelectric conversion material particles and are made of the same component as that of the thermoelectric conversion material particles; and the nano-voids in which the amorphous portions or the fine crystal portions are absent. In this way, the respective semiconductor material structural bodies contain the nano-voids on the inside. Therefore, it is possible to suppress thermal conductivity. Note that a film forming method is not limited to the aerosol deposition method. The thermoelectric conversion material particles may be filled in the holes by mechanical pressurization such as a hot press method.

The protecting section 8 is a member configured to reinforce the columnar n-type semiconductor material structural body 2 and the p-type semiconductor material structural body 3 having low strength. A material having high mechanical strength and having electric conductivity and thermal conductivity lower than the electric conductivity and the thermal conductivity of the semiconductor materials is used. By using such a material having the high mechanical strength, it is possible to protect the semiconductor material structural bodies from physical stress and mechanical deterioration.

Figure 2A:
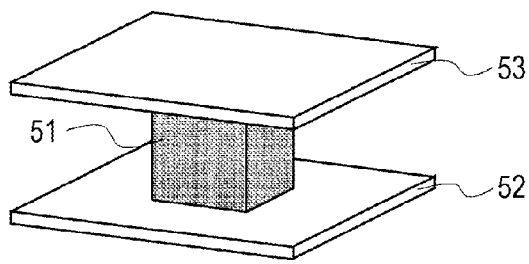
FIG. 2A to FIG. 2C are explanatory diagrams of a simulation model.

The n-type semiconductor material structural body 2 and the p-type semiconductor material structural body 3 are referred to as thermoelectric legs and a desirable shape of the thermoelectric legs is examined with reference to FIG. 2A to FIG. 4B. FIG. 2A to FIG. 2C are explanatory diagrams of a simulation model. FIG. 2A is a perspective view of a conventional model without a mold. FIG. 2B is a perspective view of a model with a mold. FIG. 2C is a sectional view of the model with the mold.

Figure 2B:
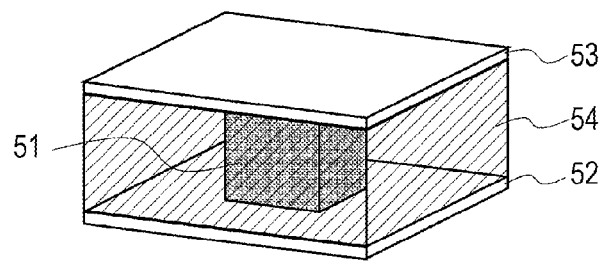
Figure 2C:
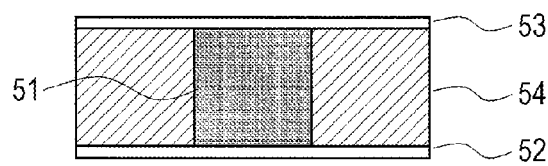

As illustrated in FIG. 2A, the conventional model is a conventional structure in which a thermoelectric leg 51 is sandwiched by a lower substrate 52 and an upper substrate 53. The model with the mold illustrated in FIG. 2B is a structure in which a mold material 54 for reinforcement is filled in a space portion. Here, as illustrated in FIG. 2C, the length of the width of the thermoelectric leg 51 and the length of one surface of the mold material 54 are set to 1:1. That is, a ratio of the area of the thermoelectric leg 51 and the area of the mold member is set to 1:8. The length of the thermoelectric leg 51 is changed in a range of an aspect ratio of 0.5 to 10.

Meshes of a finite element method (FEM) are unified at 5 μm. In some cases, a stress value by the FEM changes depending on a division method for the meshes. However, a difference in the stress value is not taken into account here.

As a boundary condition, a fixed pressure is applied to the upper substrate 53 in the vertical direction to the direction of an extending direction of the thermoelectric leg 51 in which the lower substrate 52 is fixed. Here, a pressure of 1 MPa is applied. This state is generally the same as a state in which a concentrated load is applied to a free end of a cantilever.

Figure 3:
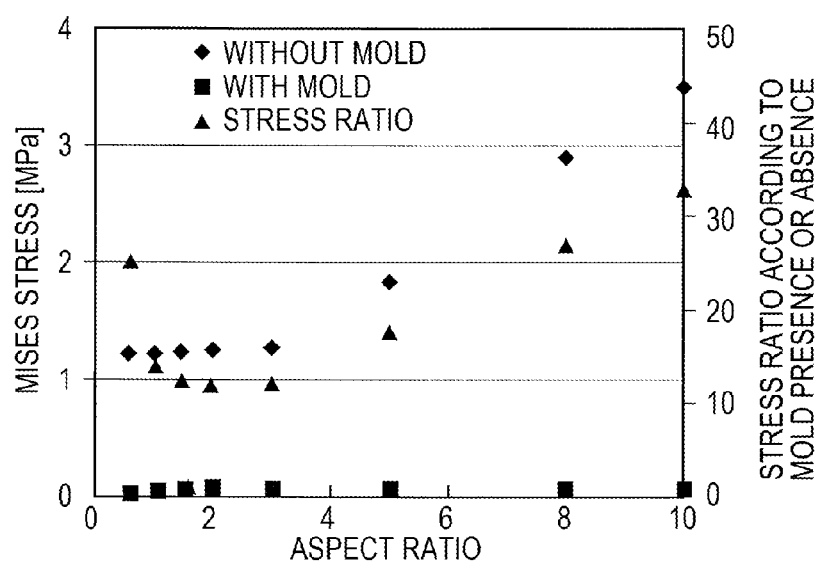
FIG. 3 is an explanatory diagram of a simulation result.

FIG. 3 is an explanatory diagram of a simulation result and depicts a result obtained by comparing a maximum von Mises stress value applied to the thermoelectric leg 51 according to presence or absence of the mold member 54. Note that a stress ratio represents stress (without mold)/stress (with mold).

As it is evident from FIG. 3, it is seen that, since the thermoelectric leg 51 has the mold material, the stress applied to the thermoelectric leg 51 decreases to 1/10 or less irrespective of an aspect ratio and the stress applied to the thermoelectric leg 51 is relaxed. On the other hand, in the structure without the mold material 54, stress concentration markedly increases when the aspect ratio increases. This is considered to be because, since a bending moment of a fixed end is proportional to a distance from a point applied with weight, the bending stress also increases as the aspect ratio increases.

Figure 4A:
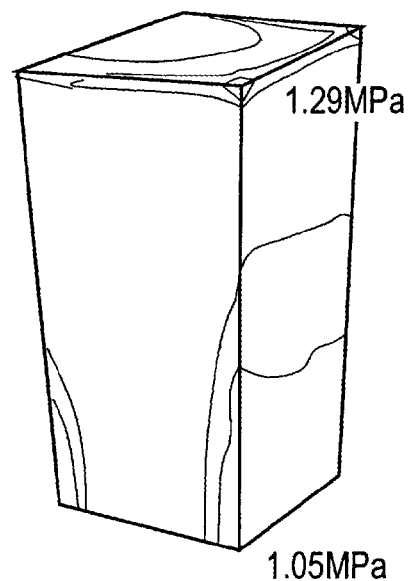
FIG. 4A and FIG. 4B are explanatory diagrams of stress distribution in which a stress concentration simulation result at an aspect ratio of 3 is compared according to presence or absence of a protecting section.
Figure 4B:
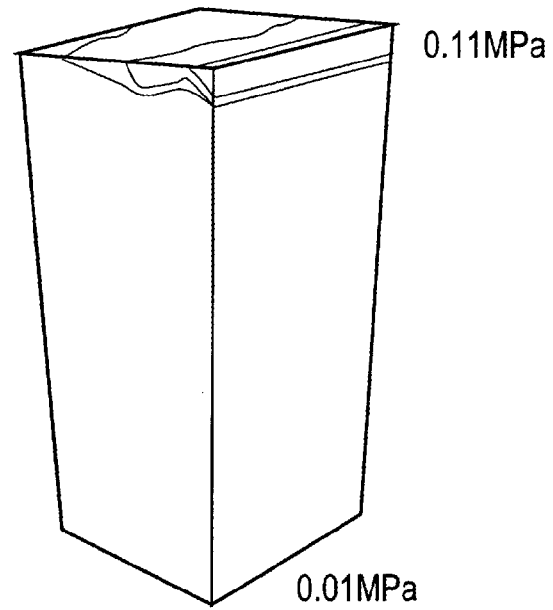

FIG. 4A and FIG. 4B are explanatory diagrams of stress distribution in which a stress concentration simulation result at an aspect ratio of 3 is compared according to presence or absence of a protecting section. As illustrated in FIG. 4A, stress concentration increases near the lower substrate in a structure without the protecting section of the mold material 54. On the other hand, stress near the lower substrate hardly increases in a structure having the mold material 54.

This is considered to be an effect obtained by two points, i.e., because the structure includes the mold material 54, the aspect ratio decreases in an entire combined structure of the thermoelectric leg 51 and the mold material 54; and the bending stress is relaxed by the protecting section having high mechanical strength. Consequently, it is made evident that it is possible to avoid stress concentration on a thermocouple by adding the protecting section by the mold material 54 and the effect of the protecting section addition is conspicuous in a thermocouple having a high aspect ratio.

By using a material having low thermal conductivity as the protecting section 8, it is possible to increase the heat resistance of the protecting section 8 as much as possible, whereby it is possible to apply a large temperature difference to the thermoelectric material. For example, as the protecting section 8, photosensitive glass or a normal glass material is used.

Note that the protecting section 8 completely fills the space between the respective semiconductor material structural bodies and completely covers portions other than the joint surfaces with the respective electrodes. When the photosensitive glass is used as the protecting section 8, holes for forming the respective columnar semiconductor material structural bodies only have to be formed in a photo etching process. When the normal glass is used, the holes only have to be formed by laser machining or the like.

The first connecting electrode 4, the second connecting electrode 5, the first output electrode 6, and the second output electrode 7 are formed of Au/Ti, Cu/Ti, Au, Ag, or the like. As a film forming method, mask sputtering, a vacuum evaporation method employing a lift-off method, a printing method, an inkjet rendering method, or the like can be used.

As the protection films 9 covering the upper surface and the lower surface, it is desirable to use a material having high thermal conductivity and high electric resistance. For example, alumina, AlN, or parylene that can be formed as a thick film by a CVD method. Alumina is generally used. However, AlN having high thermal conductivity is more suitable.

Figure 5A:
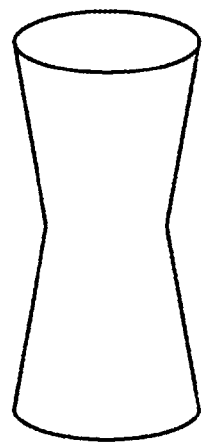
FIG. 5A to FIG. 5D are conceptual perspective views of a semiconductor material structural body configuring the thermoelectric conversion element in the embodiment of the present invention.
Figure 5B:
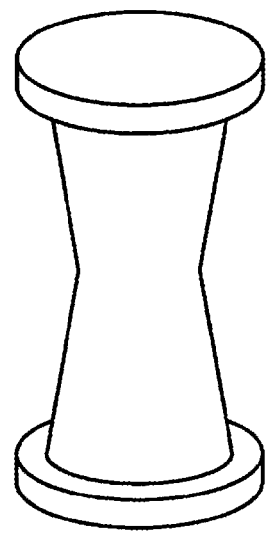

FIG. 5A to FIG. 5D are conceptual perspective views of a semiconductor material structural body configuring the thermoelectric conversion element in the embodiment of the present invention. FIG. 5A is a drum shape, an upper bottom surface and a lower bottom surface of which have a maximum diameter. Portions of the upper bottom surface and the lower bottom surface are anchor sections. In FIG. 5B, discs having thickness of 1 μm to 10 μm, for example, 5 μm are provided as anchor sections on the upper bottom surface and the lower bottom surface of the drum shape illustrated in FIG. 5A.

Figure 5C:
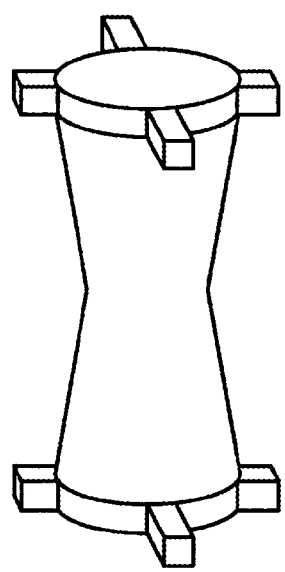
Figure 5D:
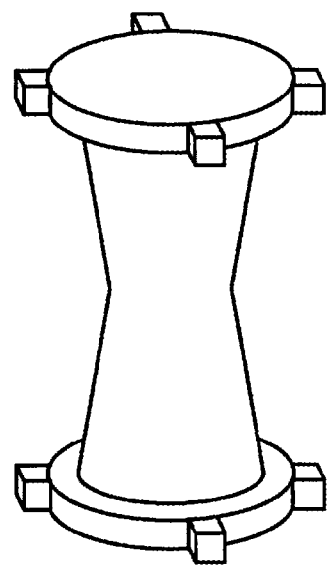

In FIG. 5C, projecting sections having thickness of 1 μm to 10 μm, for example, 5 μm are provided on the upper bottom surface and the lower bottom surface of the drum shape illustrated in FIG. 5A. In FIG. 5D, projecting sections are further formed in the shape illustrated in FIG. 5B.

By providing the anchor sections in this way, it is possible to effectively suppress slip-off of the respective semiconductor material structural bodies with partial pressurization from the up-down direction. Note that the sectional shape perpendicular to the axial direction of the respective semiconductor material structural bodies is not limited to the circular shape and may be an elliptical shape, a rectangular shape, or the like. According to the sectional shape, the shape of the anchor sections only has to be changed as appropriate. The number of projecting sections is not limited to four and may be three or may be five or more.

A protecting by the addition of anchors is examined with reference to FIG. 6 to FIG. 9. As explained above, it is possible to prevent shearing and buckling of the thermoelectric leg by the addition of the protecting section, however, it is not possible to prevent slip-off from the protecting section. It is possible to cope with the slip-off if thick and hard substrates are laminated on and under the protecting section. However, a loss of thermal energy increases. Therefore, it is assumed that the upper and lower substrates are absent.

Figure 6:
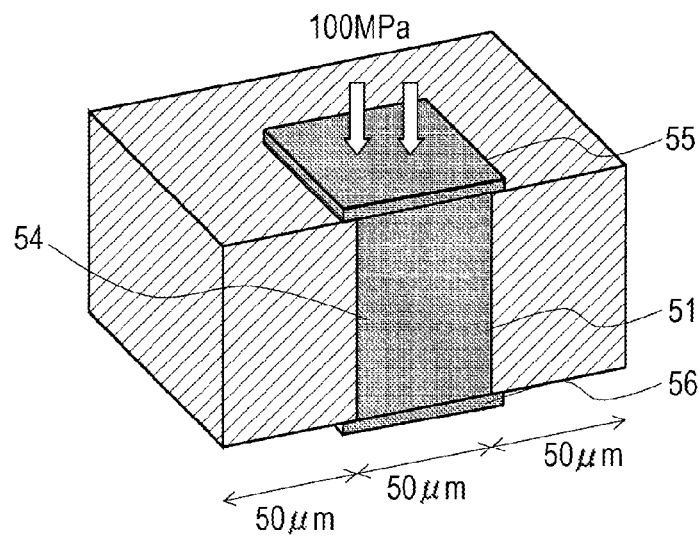
FIG. 6 is a model diagram used for a simulation.

FIG. 6 is a model diagram used for a simulation. The shape of the thermoelectric leg 51 is substantially the same as the shape illustrated in FIG. 2A to FIG. 2C. Anchors 55 and 56 are added to the upper and lower surfaces. The upper and lower surfaces of the mold material 54 are fixed. Pressure of 100 MPa is applied from the upper part of the thermoelectric leg 51.

Figure 7A:
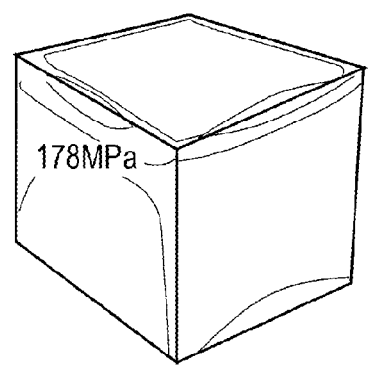
FIG. 7A and FIG. 7B are explanatory diagrams of a simulation result of shearing stress acting between a thermoelectric leg and a mold material.
Figure 7B:
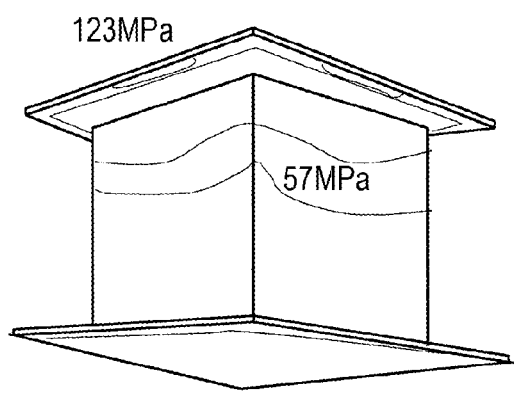

FIG. 7A and FIG. 7B are explanatory diagrams of a result of a simulation of a shearing force acting between the thermoelectric leg and the mold material. As illustrated in FIG. 7A, it is seen that, when the anchors 55 and 56 are absent, a large shearing force is applied between the thermoelectric leg 51 and the mold material 54. On the other hand, as illustrated in FIG. 7B, when the anchors 55 and 56 are provided, since compression stress is applied to the anchors 55 and 56, the shearing force between the thermoelectric leg 51 and the mold material 54 decreases.

Figure 8:
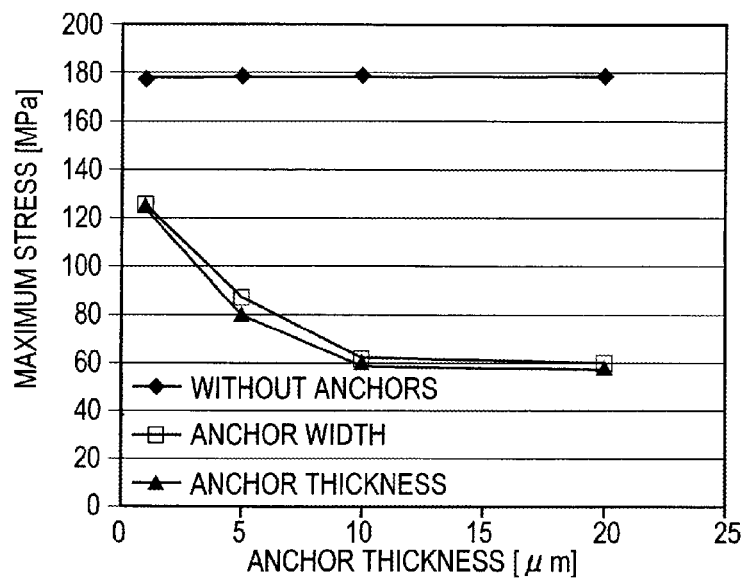
FIG. 8 is an explanatory diagram of anchor shape dependency of maximum stress applied to a side surface of the thermoelectric leg.

FIG. 8 is an explanatory diagram of anchor shape dependency of maximum stress applied to the side surface of the thermoelectric leg. A result is obtained that the maximum stress applied to the side surface of the thermoelectric leg 51 is effective even if anchor width is very small, although depending on mechanical parameters of a thermoelectric material, and saturates at anchor thickness of 10 μm.

Figure 9:
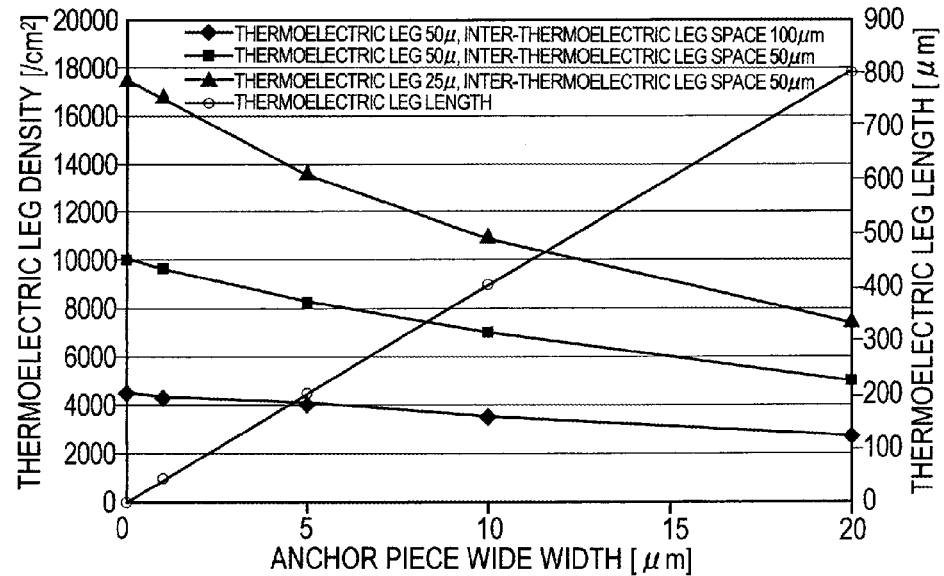
FIG. 9 is an explanatory diagram of a relation between anchor width and a thermoelectric leg shape.

FIG. 9 is an explanatory diagram of a relation between anchor width and a thermoelectric leg shape. Here, the relation is examined using thermoelectric leg density as an index. If the anchor width is increased, an area per one thermoelectric leg increases. Therefore, the thermoelectric leg density falls. When the anchor width is fixed, an area ratio occupied by the anchors increases and a rate of fall in the thermocouple density increases as the thermoelectric leg width decreases. For example, when the anchor width exceeds 20 μm, since the thermoelectric leg density falls to about a half, it is effective to set the anchor width to 20 μm or less.

In the n-type semiconductor material structural body 2 and the p-type semiconductor material structural body 3, the shortest width on the horizontal cross section is 5 μm to 500 μm, for example, 50 μm and the height is 50 μm to 500 μm, for example, 300 μm. Therefore, in an anchor having one side width of 1 μm, an area ratio of the joint surfaces with the electrodes is 1.008 times, i.e., 1% larger. An area ratio in the case of a decrease of density to a half is 2.0 times, that is, 100% larger.

On the other hand, minimum dimensions of the anchors are examined from manufacturing accuracy of the photosensitive glass. An etching selection ratio of a photosensitive section and a non-photosensitive section of the photosensitive glass is about 20:1. Since etching of through-holes advances from both surfaces of the substrate, a dimension ratio of total etching depth and anchor width is about 40:1.

Therefore, when a substrate having thickness of, for example, 400 μm is etched through, an anchor having about 10 μm on one side can be formed. When a substrate having thickness of 50 μm is etched, an anchor having about 1.2 μm on one side can be formed. In order to increase thermocouple density as explained above, it is desirable that the anchor width is as small as possible. However, it is realistic that substrate thickness is equal to or greater than 50 μm. The minimum dimension of the anchor width is set to be equal to or greater than 1 μm.

However, here, fracture strength of the thermocouple is not taken into account. Actually, it is likely that the thermocouple is broken by compression stress when the anchors are small. When the fracture strength of the thermocouple itself is small, it is preferable to form the thermocouple in a drum shape to avoid stress concentration of the anchors. When the anchor width is converted into a sidewall angle of the drum shape, the sidewall angle is about 1 degree to 5 degrees.

In the present situation, a drum-shape structure including an anchor having about 10 μm on one side is obtained. The cross-sectional area of through holes is minimum in the substrate center and is maximum on the front and rear surface of the substrate. Therefore, a thermocouple manufactured by filling a material in the through-holes is considered to less easily slip off from a photosensitive substrate even if pressure is applied from any of the substrate front surface and the substrate rear surface.

However, with a mechanical method, it is difficult to manufacture a complicated fine shape having anchors. On the other hand, when a semiconductor process is used, it is difficult to increase an aspect ratio. Since a thin film applied or formed on a substrate is processed in the semiconductor process, it is difficult to manufacture anchors at both ends of the thermocouple. On the other hand, in this structure, it is possible to attain refining, an increase in an aspect ratio, and manufacturing of upper end anchors and lower end anchors.

Note that, when the aerosol deposition method is used as the film forming method, film formation by a process at low temperature such as the normal temperature is possible. Equivalent characteristics are obtained in post treatment lower in temperature and pressure than a general pressurizing and sintering process. Therefore, it is possible to reduce temperature and pressure.

By using the aerosol deposition method, it is possible to form a finer thermoelectric material structural body having a higher aspect ratio. This is because, with simple pressurization by the hot press method, it is difficult to fill a powder material in a mold having a high aspect ratio and a conduction failure occurs. On the other hand, in the aerosol deposition method, since the powder material is ejected to the mold at high speed, it is possible to fill the material to the bottom portion of the mold. By forming a fine structural body having a high aspect ratio, it is possible to increase a temperature gradient of the thermocouple while increasing the number of thermocouples arranged in a unit area. This leads to an increase in an electromotive force of the thermoelectric conversion element.

Since the thermoelectric conversion element of the present invention is small, it is possible to apply the thermoelectric conversion element to a portable micro energy source, a local cooling device, a sensor, or the like. By setting the thermoelectric conversion element in contact with a heat source of a personal computer, it is possible to generate electric power using waste heat of the personal computer. Incidentally, by using several ten to several hundred semiconductor material structural bodies, an output of 2 mV to several hundred mV is obtained.

In this case, boosting by a boosting circuit is indispensable in order to drive a sensor device and an IC. However, since the boosting circuit has poor efficiency when an input voltage is low, the poor efficiency leads to a large amount of an energy loss. This prevents a reduction in the size of a device. Therefore, if several thousand to server ten thousand fine thermocouples are connected in series, it is possible to obtain an output of about several volts and secure a drive voltage for the sensor device and the IC with the thermoelectric conversion element alone.

EXAMPLE 1

Figure 10A:
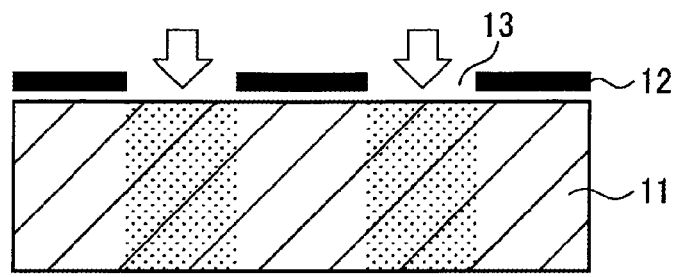
FIG. 10A to FIG. 10D are explanatory diagrams of a halfway manufacturing process of a thermoelectric conversion element of Example 1 of the present invention.

A manufacturing process for a thermoelectric conversion element in Example 1 of the present invention is explained with reference to FIG. 10A to FIG. 10J on the basis of the above explanation. First, as illustrated in FIG. 10A, ultraviolet ray exposure is applied to a photosensitive glass substrate 11 having thickness of 350 μm using a chrome mask 12 on which opening sections 13 having ϕ of 50 μm are provided in a matrix shape. Note that, here, PEG3 (a name of a product manufactured by Hoya) is used as the photosensitive glass substrate 11.

Figure 10B:
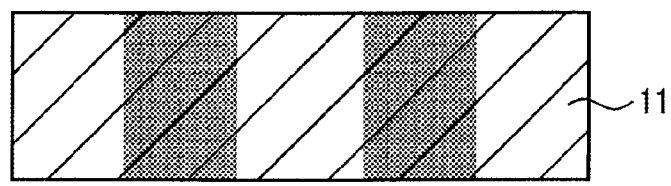

Subsequently, as illustrated in FIG. 10B, after the chrome mask 12 is removed, for example, annealing is performed at 500° C. for one hour and then at 590° C. for two hours.

Figure 10C:
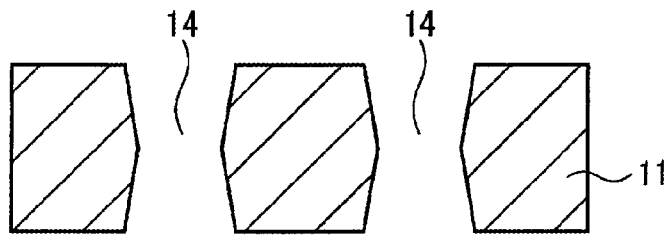

Subsequently, as illustrated in FIG. 10C, the photosensitive glass substrate 11 is immersed in hydrofluoric acid diluted by pure water and exposed sections are removed to form the through-holes 14. At this point, since etching advances from both surfaces of the photosensitive glass substrate 11, the shape of the through-holes is a drum shape.

Figure 10D:
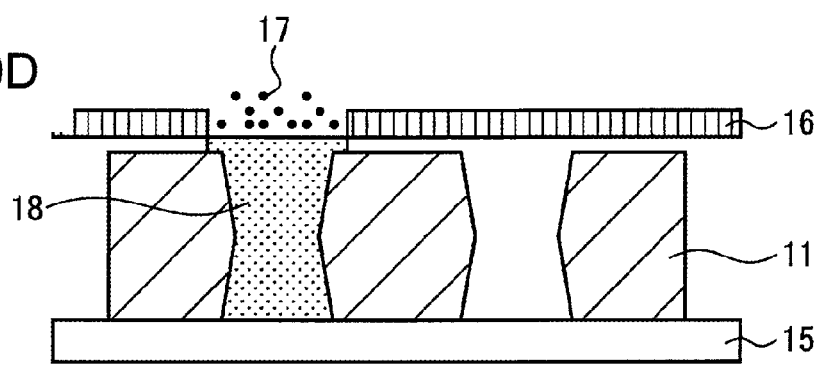

Subsequently, as illustrated in FIG. 10D, in a state in which the photosensitive glass substrate 11 is bonded on a sub-carrier 15 using, for example, a thermal release tape Revalpha (a name of a product manufactured by Nitto Denko), $Bi_2Te_3$ particles 17 having an average particle diameter of 200 nm are filled in the through-holes 14 by the aerosol deposition method using a stencil mask 16 to form an n-type semiconductor material structural body 18. Note that, as the sub-carrier 15, for example, a silicon substrate is used. The photosensitive glass substrate 11 can be peeled from the sub-carrier 15 by being heated with a hot plate or the like.

Figure 10E:
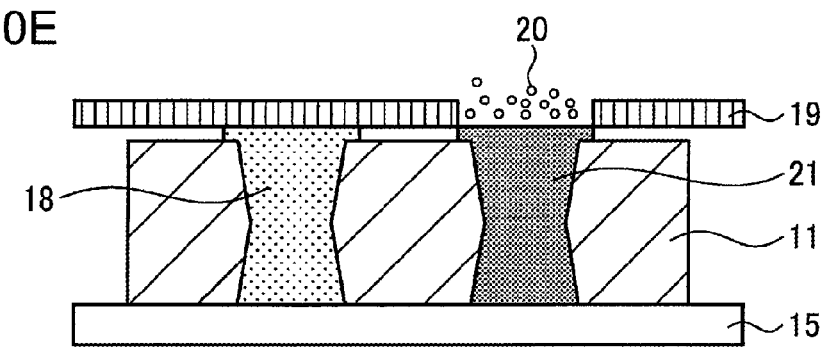
FIG. 10E to FIG. 10G are explanatory diagrams of a halfway manufacturing process after FIG. 10D of the thermoelectric conversion element in Example 1 of the present invention.

Subsequently, as illustrated in FIG. 10E, $Bi_{0.3}Sb_{1.7}Te_3$ particles 20 having an average particle diameter of 200 nm are filled in the through-holes 14 by the aerosol deposition method using a stencil mask 19 having opening sections in different positions to form a p-type semiconductor material structural body 21.

Figure 10F:
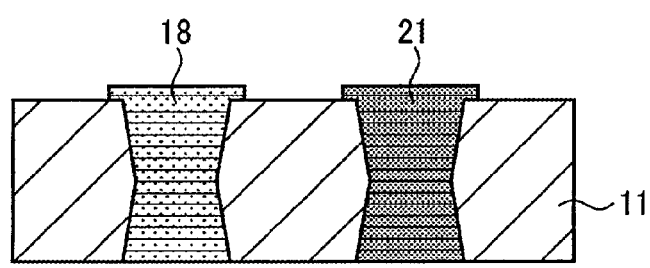

Subsequently, as illustrated in FIG. 10F, annealing is performed at 400° C. for one hour in a nitrogen gas to improve a thermoelectric characteristic of the n-type semiconductor material structural body 18 and the p-type semiconductor material structural body 21. Note that an annealing atmosphere may be in other inert gases or may be in a vacuum. At this point, if heating and pressurization are simultaneously performed using hot isotropic pressurization working (HIP) or the like, it is possible to further improve the thermoelectric characteristic.

Figure 10G:
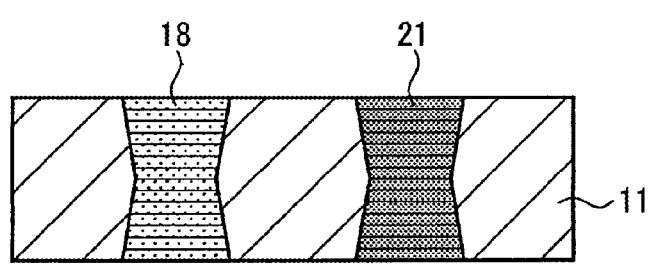

Subsequently, as illustrated in FIG. 10G, by polishing both the surfaces, projecting sections of the n-type semiconductor material structural body 18 and the p-type semiconductor material structural body 21 are removed to planarize the surfaces. Note that, instead of the polishing, wet etching or dry etching by $CH_4/H_2$ plasma may be used. Note that, when the semiconductor material contracts and sinks more than the photosensitive glass substrate 11 because of the annealing, the glass section is polished.

Figure 10H:
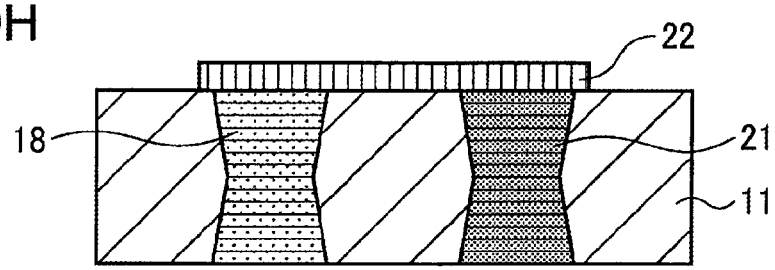
FIG. 10H to FIG. 10J are explanatory diagrams of a manufacturing process after FIG. 10G of the thermoelectric conversion element in Example 1 of the present invention.

Subsequently, as illustrated in FIG. 10H, Au/Ti is selectively deposited using the mask sputtering method to form an upper electrode 22 that connects one end faces of the n-type semiconductor material structural body 18 and the p-type semiconductor material structural body 21 in series. At this point, output electrodes are formed on output end sides of the n-type semiconductor material structural body 18 and the p-type semiconductor material structural body 21.

Figure 10I:
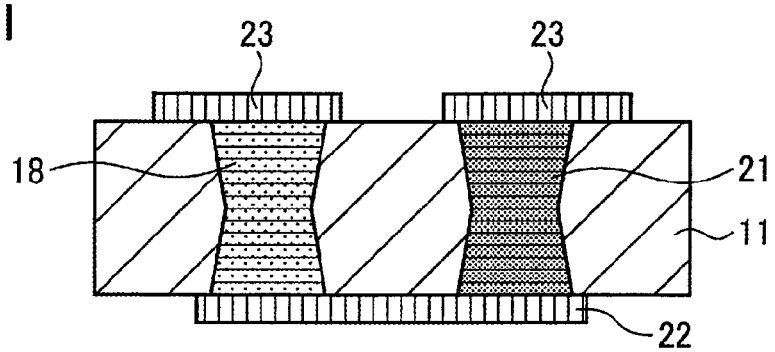

Subsequently, as illustrated in FIG. 10I, Au/Ti is selectively deposited using the mask sputtering method to form a lower electrode 23 that connects the other end faces of the n-type semiconductor material structural body 18 and the p-type semiconductor material structural body 21 in series.

Figure 10J:
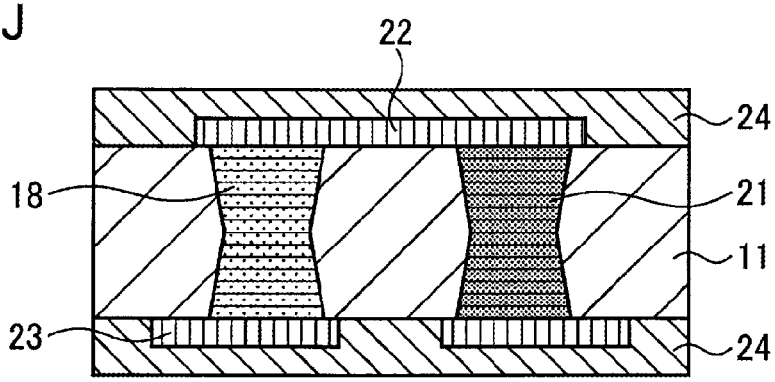

Subsequently, as illustrated in FIG. 10J, after AlN films 24 having thickness of 1 μm are deposited on both the surfaces using the sputtering method, opening sections (not illustrated in the figure) for exposing the output electrodes are formed. Consequently, a basic configuration of the thermoelectric conversion element in Example 1 of the present invention is completed.

As explained above, in Example 1 of the present invention, the shape of the through-holes is the drum shape and the upper end portion and the lower end portion are set to the maximum diameter. Therefore, since the maximum diameter sections function as the anchors, it is possible to effectively suppress slip-off of the respective semiconductor material structural bodies with partial pressurization from the up-down direction.

EXAMPLE 2

Figure 11A:
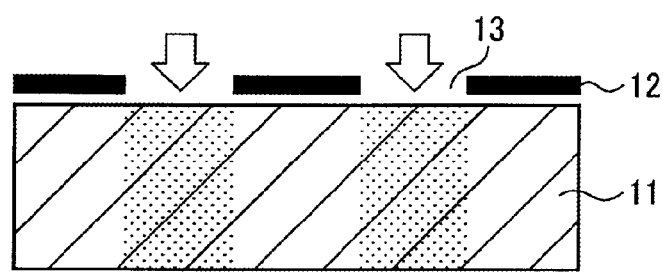
FIG. 11A to FIG. 11D are explanatory diagrams of a halfway manufacturing process of a thermoelectric conversion element in Example 2 of the present invention.

Next, a manufacturing process for a thermoelectric conversion element in Example 2 of the present invention is explained with reference to FIG. 11A to FIG. 11J. First, as illustrated in FIG. 11A, ultraviolet ray exposure is applied to a photosensitive glass substrate 11 having thickness of 350 μm using the chrome mask 12 on which the opening sections 13 having ϕ of 50 μm are provided in a matrix shape. Note that, here, PEG3 (a name of a product manufactured by Hoya) is used as the photosensitive glass substrate 11.

Figure 11B:
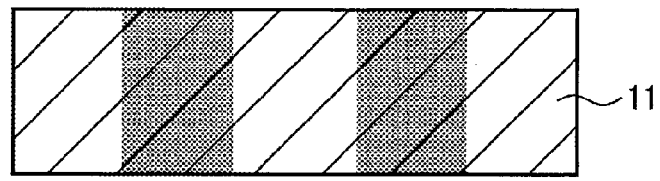

Subsequently, as illustrated in FIG. 11B, after the chrome mask 12 is removed, for example, annealing is performed at 500° C. for one hour and then at 590° C. for two hours.

Figure 11C:
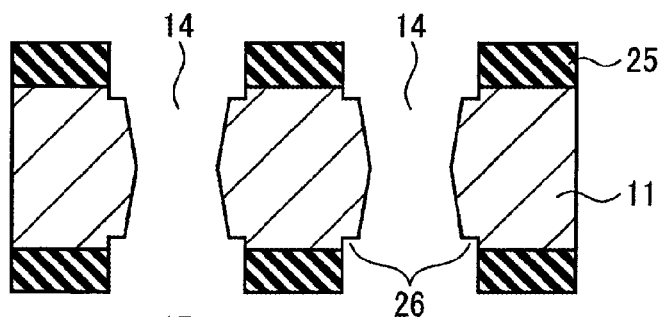

Subsequently, as illustrated in FIG. 11C, after a resist mask 25 including opening sections functioning as patterns for anchors having a diameter greater than exposed sections is provided, the photosensitive glass substrate 11 is immersed in hydrofluoric acid diluted by pure water and the exposed sections are removed to form the through-holes 14. At this point, since unexposed sections have an etching rate smaller than an etching rate of the exposed sections, anchor sections 26 are formed at both end portions of the through-holes 14. Note that, as in Example 1, etching advances from both surfaces of the photosensitive glass substrate 11, the shape of the through-holes 14 themselves is a drum shape.

Figure 11D:
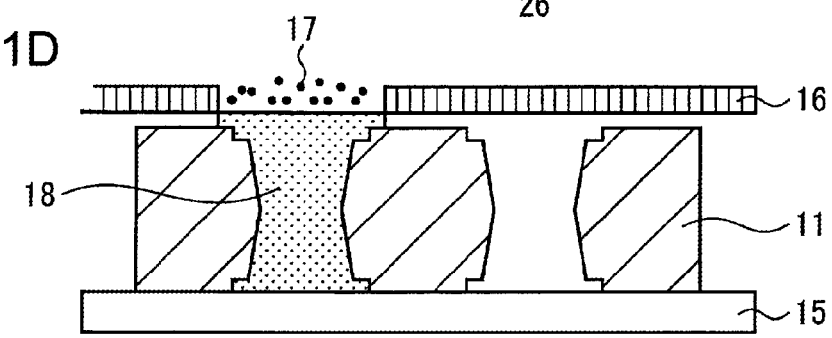

Subsequently, as illustrated in FIG. 11D, in a state in which the photosensitive glass substrate 11 is bonded on the sub-carrier 15 using, for example, the thermal release tape Revalpha (a name of a product manufactured by Nitto Denko), the $Bi_2Te_3$ particles 17 having an average particle diameter of 200 nm are filled in the through-holes 14 by the aerosol deposition method using the stencil mask 16 to form the n-type semiconductor material structural body 18. Note that, as the sub-carrier 15, for example, a silicon substrate is used.

Figure 11E:
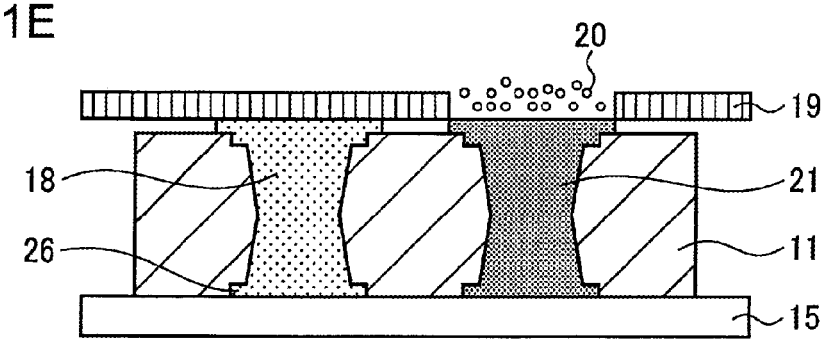
FIG. 11E to FIG. 11G are explanatory diagrams of a halfway manufacturing process after FIG. 11D of the thermoelectric conversion element in Example 2 of the present invention.

Subsequently, as illustrated in FIG. 11E, $Bi_{0.3}Sb_{1.7}Te_3$ particles 20 having an average particle diameter of 200 nm are filled in the through-holes 14 by the aerosol deposition method using the stencil mask 19 having opening sections in different positions to form the p-type semiconductor material structural body 21. Note that, when a filling ratio in the anchor sections 26 on the lower end side is low, it is sufficient to reverse the photosensitive glass substrate 11 and bond the photosensitive glass substrate 11 on the sub-carrier 15 and repeat the same process for the n type and the p type.

Figure 11F:
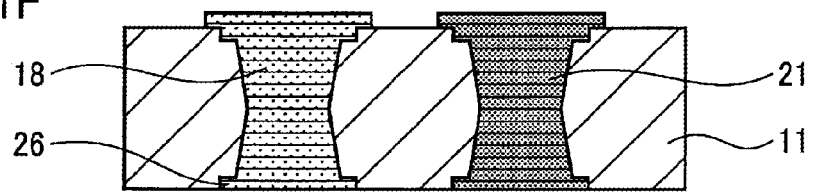

Subsequently, as illustrated in FIG. 11F, annealing is performed at 400° C. for one hour in a nitrogen gas to improve a thermoelectric characteristic of the n-type semiconductor material structural body 18 and the p-type semiconductor material structural body 21. Note that an annealing atmosphere may be in other inert gases or may be in a vacuum.

Figure 11G:
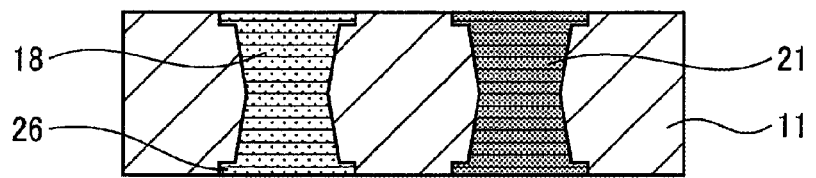

Subsequently, as illustrated in FIG. 11G, by polishing both the surfaces, the projecting sections of the n-type semiconductor material structural body 18 and the p-type semiconductor material structural body 21 are removed to planarize the surfaces. Note that, instead of the polishing, wet etching or dry etching by $CH_4/H_2$ plasma may be used. Note that, when the semiconductor material contracts and sinks more than the photosensitive glass substrate 11 because of the annealing, the glass section is polished.

Figure 11H:
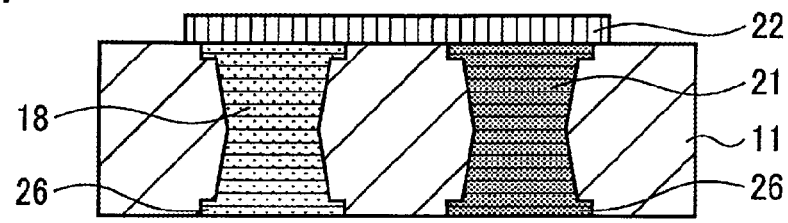
FIG. 11H to FIG. 11J are explanatory diagrams of a manufacturing process after FIG. 11G of the thermoelectric conversion element in Example 2 of the present invention.

Subsequently, as illustrated in FIG. 11H, Au/Ti is selectively deposited using the mask sputtering method to form the upper electrode 22 that connects one end faces of the n-type semiconductor material structural body 18 and the p-type semiconductor material structural body 21 in series. At this point, output electrodes are formed on output end sides of the n-type semiconductor material structural body 18 and the p-type semiconductor material structural body 21.

Figure 11I:
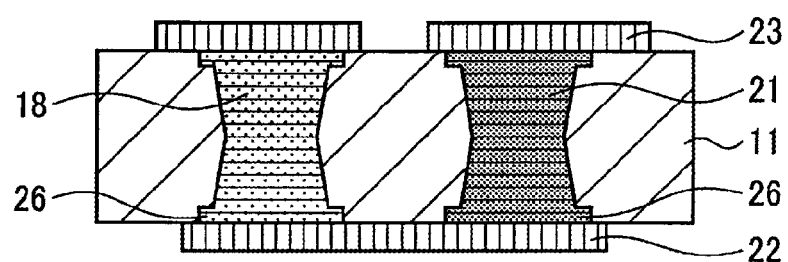

Subsequently, as illustrated in FIG. 11I, Au/Ti is selectively deposited using the mask sputtering method to form the lower electrode 23 that connects the other end faces of the n-type semiconductor material structural body 18 and the p-type semiconductor material structural body 21 in series.

Figure 11J:
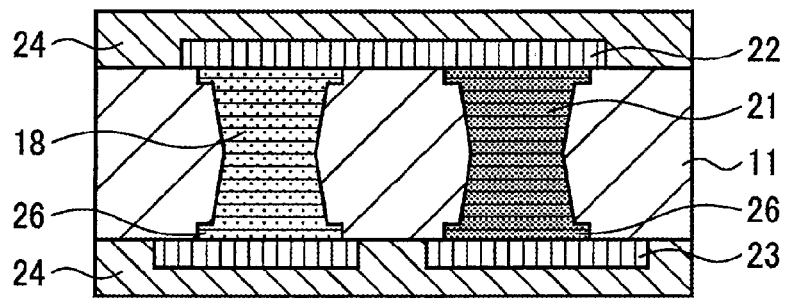
Figure 12A:
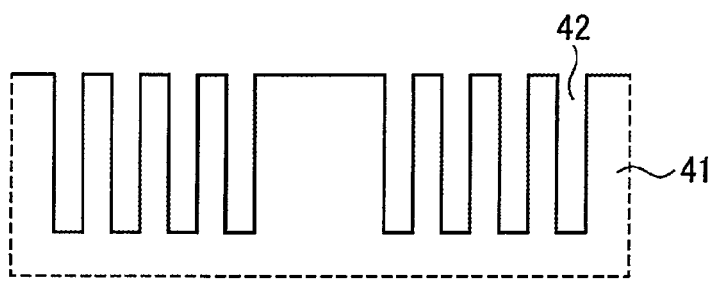
FIG. 12A to FIG. 12D are explanatory diagrams of an example of a process for forming a conventional micro thermoelectric conversion element.
Figure 12B:
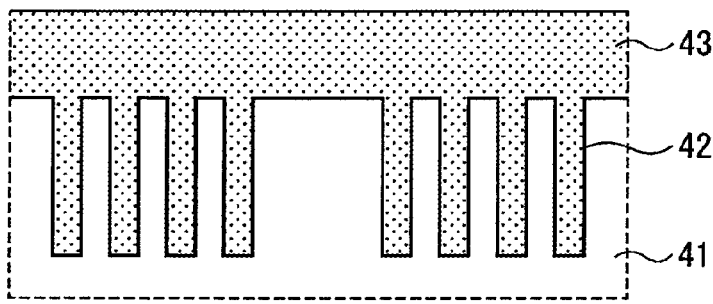
Figure 12C:
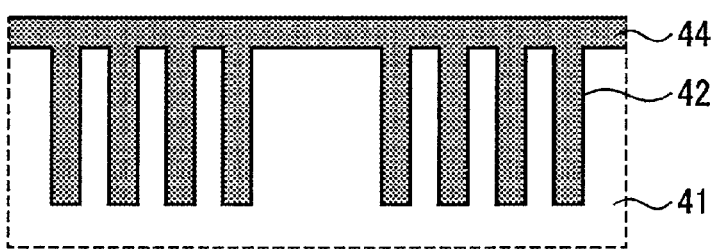
Figure 12D:
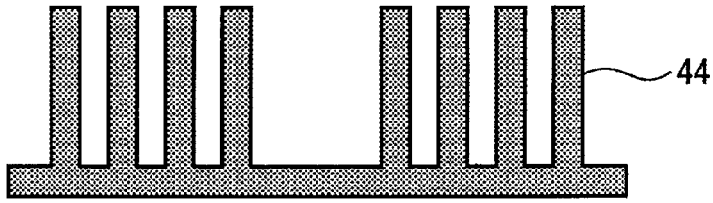

Subsequently, as illustrated in FIG. 11J, after the AlN films 24 having thickness of 1 µm are deposited on both the surfaces using the sputtering method, opening sections (not illustrated in the figure) for exposing the output electrodes are formed. Consequently, a basic configuration of the thermoelectric conversion element in Example 2 of the present invention is completed.

As explained above, in Example 2 of the present invention, the anchor sections are intentionally formed in the forming process for the through-holes. Therefore, it is possible to more effectively suppress slip-off of the respective semiconductor material structural bodies with partial pressurization from the up-down direction.

If a loss of thermal energy is allowed, a silicon substrate can also be adopted as the mold. In this case, in the steps of FIG. 11A to FIG. 11C, it is possible to obtain an equivalent shape by etching the silicon substrate in two stages.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A thermoelectric conversion element comprising:
    at least one n-type semiconductor material structural body;
    at least one p-type semiconductor material structural body;
    discal anchor sections having thickness of 1 µm to 10 µm on an upper bottom surface and a lower bottom surface of the n-type semiconductor material structural body;
    discal anchor sections having thickness of 1 µm to 10 µm on an upper bottom surface and a lower bottom surface of the p-type semiconductor material structural body;
    a protecting section between the n-type semiconductor material structural body and the p-type semiconductor material structural body;
    a first connecting electrode connected in series to a first discal anchor section of the n-type semiconductor material structural body and a first discal anchor section of the p-type semiconductor material structural body;
    a first output electrode for an n-side output connected to a second discal anchor section of the n-type semiconductor material structural body; and
    a second output electrode for a p-side output connected to a second discal anchor section of the p-type semiconductor material structural body, wherein
    areas of respective joint sections of the n-type semiconductor material structural body with the first discal anchor section and the second discal anchor section and of the p-type semiconductor material structural body with the first discal anchor section and the second discal anchor section are greater than respective cross-sectional areas in other positions, in an axial direction, of the n-type semiconductor material structural body and the p-type semiconductor material structural body;
    a long diameter for a minimum portion of each of the n-type semiconductor material structural body and the p-type semiconductor material structural body in the axial direction is 5 µm to 100 µm; and
    cross-sectional shapes of the n-type semiconductor material structural body and the p-type semiconductor material structural body along the axial direction are each a drum shape that gradually tapers in a direction from each of the first and second discal anchor sections toward the minimum portion of the p-type and n-type semiconductor material structural body,
    wherein the discal anchor sections have a plurality of radial protrusions projecting in a radial direction.

2. The thermoelectric conversion element according to claim 1, wherein
    the n-type semiconductor material structural body and the p-type semiconductor material structural body are both provided in plurality, the number of the n-type semiconductor material structural bodies being the same as that of the p-type semiconductor material structural bodies,
    the thermoelectric conversion element includes a second connecting electrode connected in series to the second discal anchor section of one of the n-type semiconductor material structural body that is provided in plurality and the second discal anchor section of one of the p-type semiconductor material structural body that is provided in plurality to connect the one of the n-type semiconductor material structural body and the one of the p-type semiconductor material structural body in series.

3. The thermoelectric conversion element according to claim 1, wherein a width of the n-type semiconductor material structural body or the p-type semiconductor material structural body is 1 µm to 20 µm greater than its minimum portion in the axial direction on the upper-and-lower surface of the n-type semiconductor material structural body or the p-type semiconductor material structural body.

4. The thermoelectric conversion element according to claim 1, wherein expansion of the n-type semiconductor material structural body or the p-type semiconductor material structural body is at least 1% to 100% greater than the minimum portion in the axial direction on the upper-and-lower surface of the n-type semiconductor material structural body or the p-type semiconductor material structural body.

5. The thermoelectric conversion element according to claim 1, wherein a sidewall angle of the drum shape is 1 degree to 5 degrees.

6. The thermoelectric conversion element according to claim 1, wherein the protecting section is a material having higher electric resistivity and higher thermal resistivity than any of the n-type semiconductor material structural body and the p-type semiconductor material structural body.

7. The thermoelectric conversion element according to claim 6, wherein the protecting section is photosensitive glass.

* * * * *